US007426462B2

(12) United States Patent
Young et al.

(10) Patent No.: US 7,426,462 B2
(45) Date of Patent: Sep. 16, 2008

(54) FAST CODEBOOK SELECTION METHOD IN AUDIO ENCODING

(75) Inventors: Jeongnam Young, San Jose, CA (US); Sundararam Dwarakanath, Milpitas, CA (US); Cheung Auyeung, Sunnyvale, CA (US); Takao Yamazaki, Saratoga, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 928 days.

(21) Appl. No.: 10/674,980

(22) Filed: Sep. 29, 2003

(65) Prior Publication Data

US 2005/0075888 A1 Apr. 7, 2005

(51) Int. Cl.
  *G10L 19/00* (2006.01)
(52) U.S. Cl. .................................. 704/200.1
(58) Field of Classification Search .............. 704/200.1, 704/500–504
  See application file for complete search history.

(56) References Cited

U.S. PATENT DOCUMENTS

| | | | |
|---|---|---|---|
| 4,964,113 A | 10/1990 | Geyer et al. | |
| 5,309,526 A * | 5/1994 | Pappas et al. | 382/237 |
| 5,488,665 A | 1/1996 | Johnston et al. | |
| 5,497,435 A | 3/1996 | Berger | |
| 5,517,581 A * | 5/1996 | Johnston et al. | 382/232 |
| 5,535,300 A | 7/1996 | Hall, II et al. | |
| 5,596,676 A | 1/1997 | Swaminathan et al. | |
| 5,636,324 A | 6/1997 | Teh et al. | |
| 5,657,454 A | 8/1997 | Benbassat et al. | |
| 5,682,442 A * | 10/1997 | Johnston et al. | 382/239 |
| 5,703,579 A | 12/1997 | Nonaka et al. | |
| 5,717,764 A | 2/1998 | Johnston et al. | |
| 5,729,556 A | 3/1998 | Benbassat et al. | |
| 5,748,763 A | 5/1998 | Rhoads | |
| 5,758,315 A | 5/1998 | Mori | |
| 5,777,812 A | 7/1998 | Kim | |
| 5,864,802 A | 1/1999 | Kim | |
| 5,893,066 A | 4/1999 | Hong | |
| 5,946,652 A | 8/1999 | Heddle | |
| 5,956,674 A | 9/1999 | Smyth et al. | |

(Continued)

OTHER PUBLICATIONS

Poondikulam L.S., et al., "Efficient Implementation Of Transform Based Audio Coders Using SIMD Paradigm and Multifuction Computations", Sasken Communications Technologies, Limited, Bangalore, India, Availble: http://www.sasken.com/others/wpapers/paper_0007.pdf, 5 pages.

(Continued)

*Primary Examiner*—Michael N Opsasnick
(74) *Attorney, Agent, or Firm*—Blakely, Sokoloff, Taylor & Zafman LLP

(57) ABSTRACT

The largest absolute value (LAV) is determined within a group of data. Based on the LAV, a difference table is identified that is to be used for selecting an optimal Huffman codebook for the group of data. The difference table is associated with two Huffman codebooks. Further, one or more indexes are calculated for the group of data using an expression associated with the two Huffman codebooks, and a size difference value is determined for the group of data using the calculated indexes and the difference table. Based on the determined size difference value, the optimal Huffman codebook is selected from the above two codebooks.

22 Claims, 8 Drawing Sheets

U.S. PATENT DOCUMENTS

| | | | |
|---|---|---|---|
| 5,982,935 | A | 11/1999 | Arbel |
| 5,999,899 | A | 12/1999 | Robinson |
| 6,108,622 | A | 8/2000 | Xue |
| 6,173,024 | B1 | 1/2001 | Nanba et al. |
| 6,282,631 | B1 | 8/2001 | Arbel |
| 6,295,009 | B1 | 9/2001 | Goto |
| 6,298,087 | B1 | 10/2001 | Luna et al. |
| 6,308,150 | B1 | 10/2001 | Neo et al. |
| 6,330,335 | B1 | 12/2001 | Rhoads |
| 6,344,808 | B1 | 2/2002 | Taruki et al. |
| 6,349,284 | B1 | 2/2002 | Sung |
| 6,424,939 | B1 | 7/2002 | Herre et al. |
| 6,456,963 | B1 | 9/2002 | Araki |
| 6,484,142 | B1 * | 11/2002 | Miyasaka et al. ........... 704/500 |
| 6,487,535 | B1 | 11/2002 | Smyth et al. |
| 6,529,604 | B1 | 3/2003 | Park et al. |
| 6,542,863 | B1 | 4/2003 | Surucu |
| 6,577,252 | B2 | 6/2003 | Hotta |
| 6,587,057 | B2 | 7/2003 | Scheuermann |
| 6,662,154 | B2 | 12/2003 | Mittal et al. |
| 6,704,705 | B1 | 3/2004 | Kavbal et al. |
| 6,794,996 | B2 | 9/2004 | Tsutsui et al. |
| 6,799,164 | B1 | 9/2004 | Araki |
| 6,950,794 | B1 | 9/2005 | Subramaniam et al. |
| 2003/0079222 | A1 | 4/2003 | Boykin et al. |
| 2003/0083867 | A1 | 5/2003 | Lopez-Estrada et al. |
| 2003/0088400 | A1 | 5/2003 | Nishio et al. |
| 2003/0115052 | A1 | 6/2003 | Chen et al. |
| 2003/0142746 | A1 | 7/2003 | Tanaka et al. |
| 2003/0187634 | A1 | 10/2003 | Li |
| 2003/0215013 | A1 | 11/2003 | Budnikov |
| 2004/0088160 | A1 | 5/2004 | Manu |
| 2004/0162720 | A1 | 8/2004 | Jang et al. |

OTHER PUBLICATIONS

Wang, Y., et al., "An Excitation Level Based Psychoacoustic Model For Audio Compression", Nokia Research Center, Speech and Audio Systems Lab, Tampere Finland, Downloaded May 29, 2003, Available: http:www.kom.e-technik.tu-darmstadt.de/acmmm99ep/wang.

Michael J. Smithers, Matt C. Fellers, "Increased efficiency MPEG-2 AAC Encoding", Audio Engineering Safety, Convention Paper 5490, Presented at 111th Convention, Sep. 21-24, 2001, pp. 1-7, New York, New York, USA.

Danijel Domazet, Mario Kovac, "Advanced Software Implementation Of MPEG-4 AAC Audio Encoder", EC-VIP-MC, 2003, 4th EURASIP Conference focused on Video/Imaging and Multimedia Communictions, Jul. 2-5, 2003, Zagreb, Croatia.

Poondikulam L.S., et al., "Efficient Implementation Of Transform Based Audio Coders Using SIMD Paradigm and Multifuction Computations", Sasken Communications Technologies, Limited, Bangalore, India, Available: http://www.sasken.com/others/wpapers/paper_0007.pdf, 5 pages; 2006.

* cited by examiner

| Codebook Number, i | Unsigned_cb[i] | Dimension of Codebook | Largest Absolute Value for Codebook | Codebook listed in Table |
|---|---|---|---|---|
| 0 | - | - | 0 | - |
| 1 | 0 | 4 | 1 | A.2 |
| 2 | 0 | 4 | 1 | A.3 |
| 3 | 1 | 4 | 2 | A.4 |
| 4 | 1 | 4 | 2 | A.5 |
| 5 | 0 | 2 | 4 | A.6 |
| 6 | 0 | 2 | 4 | A.7 |
| 7 | 1 | 2 | 7 | A.8 |
| 8 | 1 | 2 | 7 | A.9 |
| 9 | 1 | 2 | 12 | A.10 |
| 10 | 1 | 2 | 12 | A.11 |
| 11 | 1 | 2 | (16) ESC | A.12 |
| 12 | - | - | (reserved) | |
| 13 | - | - | percept. noise subst. | |
| 14 | - | - | intensity out-of-phase | |
| 15 | - | - | intensity in-phase | |

Spectrum Huffman codebooks parameters

FIG. 2

```
DIFF_TAB_1[] = {

2, 2, 2, 0, 2, 1, 2, 0, 2, 1, 2, 0, 0, 0, 0, 0, 2, 1, 3, 0, 1, 0,1, 0, 2, 1, 2, 0, 0,
0, 0, 0, 2, 2, 3, 0, 1, 1, 1, 0, 2, 2, 2, 0, 0, 0, 0, 0, 0, 0, 0, 0, 0, 0, 0, 0, 0, 0,
0, 0, 0, 0, 0, 0, 1, 1, 2, 0, 1, 0, 1, 0, 2, 1, 1, 0, 0, 0, 0, 0, 1, 0, 1, 0, 0, -2, 0,
0, 1, 0, 1, 0, 0,0, 0, 0, 1, 1, 2, 0, 1, 0, 1, 0, 1, 1, 1, 0, 0, 0, 0, 0, 0, 0, 0, 0,
0, 0, 0, 0, 0, 0, 0, 0, 0, 0, 2, 2, 2, 0, 1, 1, 1, 0, 3, 2, 2, 0, 0, 0, 0, 0, 2,
1, 2, 0, 1, 1, 1, 0, 1, 1, 3, 0, 0, 0, 0, 0, 2, 2, 2, 0, 3, 1, 1, 0, 2, 2, 2 };
```

```
DIFF_TAB_2[] = {

-3, -1, 0, 0, -1, 1, 0, 0, 0, 1, -1, 0, 0, 0, 0, 0, -1, 1, 1, 0, 1, 2, 1, 0,
1, 2, 0, 0, 0, 0, 0, 0, 0, 2, 2, 0, 1, 1, 1, 0, 0, 0, 1, 0, 0, 0, 0, 0, 0, 0, 0, 0,
0, 0, 0, 0, 0, 0, 0, 0, 0, 0, 1, 2, 0, 0, 2, 3, 2, 0, 2, 2, 2, 0, 0, 0, 0, 0, 1, 3,
3, 0, 2, 3, 3, 0, 1, 2, 2, 0, 0, 0, 0, 0, 1, 2, 3, 0, 1, 2, 3, 0, 0, 2, 2, 0, 0, 0, 0,
0, 0, 0, 0, 0, 0, 0, 0, 0, 0, 0, 0, 0, 0, 0, 0, 2, 4, 0, 1, 4, 5, 0, 2, 4, 4, 0,
0, 0, 0, 0, 0, 3, 4, 0, 2, 3, 5, 0, 2, 3, 4, 0, 0, 0, 0, 0, 2, 4, 0, 0, 2, 4, 0, 1,
2, 4 };
```

```
DIFF_TAB_3 [] = {

2, 2, 2, 2, 1, 2, 2, 2, 2, 0, 0, 0, 0, 0, 0, 0, 2, 2, 2, 2, 1, 2, 2, 2, 2, 0, 0, 0, 0,
0, 0, 0, 3, 2, 3, 2, 1, 2, 3, 2, 2, 0, 0, 0, 0, 0, 0, 0, 2, 2, 2, 1, 0, 1, 2, 2, 2, 0,
0, 0, 0, 0, 0, 0, 1, 1, 1, 0, -3, 0, 1, 1, 2, 0, 0, 0, 0, 0, 0, 0, 2, 2, 2, 1, 0, 1, 2,
2, 2, 0, 0, 0, 0, 0, 0, 0, 2, 2, 3, 2, 1, 2, 3, 2, 2, 0, 0, 0, 0, 0, 0, 0, 2, 2, 2, 2,
1, 2, 3, 3, 2, 0, 0, 0, 0, 0, 0, 0, 2, 2, 3, 2, 1, 1, 2, 2, 2 };
```

```
DIFF_TAB_4 [] = {

-4, -1, 1, 1, 1, 1, 1, 1, -1, 1, 2, 2, 2, 1, 2, 1, 1, 2, 3, 3, 2, 2, 2, 2, 1, 2, 3, 2,
3, 2, 2, 2, 1, 2, 3, 3, 3, 3, 2, 2, 1, 1, 3, 2, 3, 2, 3, 1, 1, 2, 2, 2, 2, 3, 3, 3, 1,
2, 2, 2, 2, 2, 3, 2 };
```

```
DIFF_TAB_5 [] = {

FAST CODEBOOK SELECTION METHOD IN AUDIO ENCODING

FIELD OF THE INVENTION

The invention relates to audio encoding in general. More particularly, the invention relates to a selection of an optimal Huffman codebook for encoding of digital data.

COPYRIGHT NOTICE/PERMISSION

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright © 2001, Sony Electronics, Inc., All Rights Reserved.

BACKGROUND OF THE INVENTION

In recent years, efficient audio signal compression methods encode spectral data of quantized audio signals by using a Huffman encoding scheme. The standardized body, Motion Picture Experts Group (MPEG), discloses conventional data compression methods in their standards such as, for example, the MPEG-2 advanced audio coding (AAC) standard (see ISO/IEC 13818-7) and the MPEG-4 AAC standard (see ISO/IEC 14496-3). These standards are collectively referred to herein as the MPEG standard.

According to the MPEG standard, an input pulse code modulation (PCM) signal may be converted through a modified discrete cosine transform (MDCT) operation into 1024 elements of frequency spectral data that are quantized (converted into integers) using a non-linear quantization method. The 1024 elements of quantized frequency spectral data are then grouped into a number of scale factor bands (SFBs). Each SFB contains a multiple of 2 or 4 quantized spectral coefficients. The SFBs may also be grouped into sections.

Next, the quantized and grouped frequency spectral data is Huffman-encoded. The Huffman encoding operation is performed based on Huffman codebooks. Each section is encoded using a single Huffman codebook selected among eleven Huffman codebooks provided by the MPEG standard. Each Huffman codebook includes indexes of data items to be encoded, corresponding "codewords" (hexadecimal representations of encoded data items) and the code length of each codeword.

According to the MPEG standard, Huffman codebooks that can be selected for a section are limited by the largest absolute value (LAV) of the spectral data within the section. That is, the LAV of the spectral data has to be smaller than the LAV associated with a Huffman codebook that can be used for the section. Based on the MPEG standard, if the LAV of the spectral data within the section is less than 2, then the candidate Huffman codebooks are codebooks 0, 1 and 2. If the LAV of the spectral data within the section is less than 3, then candidate Huffman codebooks are codebooks 0 through 4. If the LAV of the spectral data within the section is less than 5, then candidate Huffman codebooks are codebooks 0 through 6. If the LAV of the spectral data within the section is less than 8, then candidate Huffman codebooks are codebooks 0 through 8. If the LAV of the spectral data within the section is less than 13, then candidate Huffman codebooks are codebooks 0 through 10. Finally, if the LAV of the spectral data within the section is greater, or equal to 13, then candidate Huffman codebooks are codebooks 0 through 11.

Once the candidate Huffman codebooks are selected, the code length which would result when encoding data with each candidate Huffman codebook is determined and the results are compared. The candidate Huffman codebook that gives the smaller code length is selected and used for Huffman-encoding of the spectrum data in the section.

The above-described conventional method of selecting the optimal Huffman codebook for a section takes a large amount of computation because the operation of calculating the index and obtaining a corresponding code length must be performed separately for each of the candidate Huffman codebooks.

SUMMARY OF THE INVENTION

The largest absolute value (LAV) is determined within a group of data. Based on the LAV, a difference table is identified that is to be used for selecting an optimal Huffman codebook for the group of data. The difference table is associated with two Huffman codebooks. Further, one or more indexes are calculated for the group of data using an expression associated with the two Huffman codebooks, and a size difference value is determined for the group of data using the calculated indexes and the difference table. Based on the determined size difference value, the optimal Huffman codebook is selected from the above two codebooks.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 2 illustrates a table containing parameters of Huffman codebooks as provided by the MPEG standard.

FIG. 7 illustrates exemplary contents of difference tables 1 through 5, according to one embodiment of the present invention.

DETAILED DESCRIPTION OF THE INVENTION

In the following detailed description of embodiments of the invention, reference is made to the accompanying drawings in which like references indicate similar elements, and in which is shown, by way of illustration, specific embodiments in which the invention may be practiced. These embodiments are described in sufficient detail to enable those skilled in the art to practice the invention, and it is to be understood that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

Figure 1:
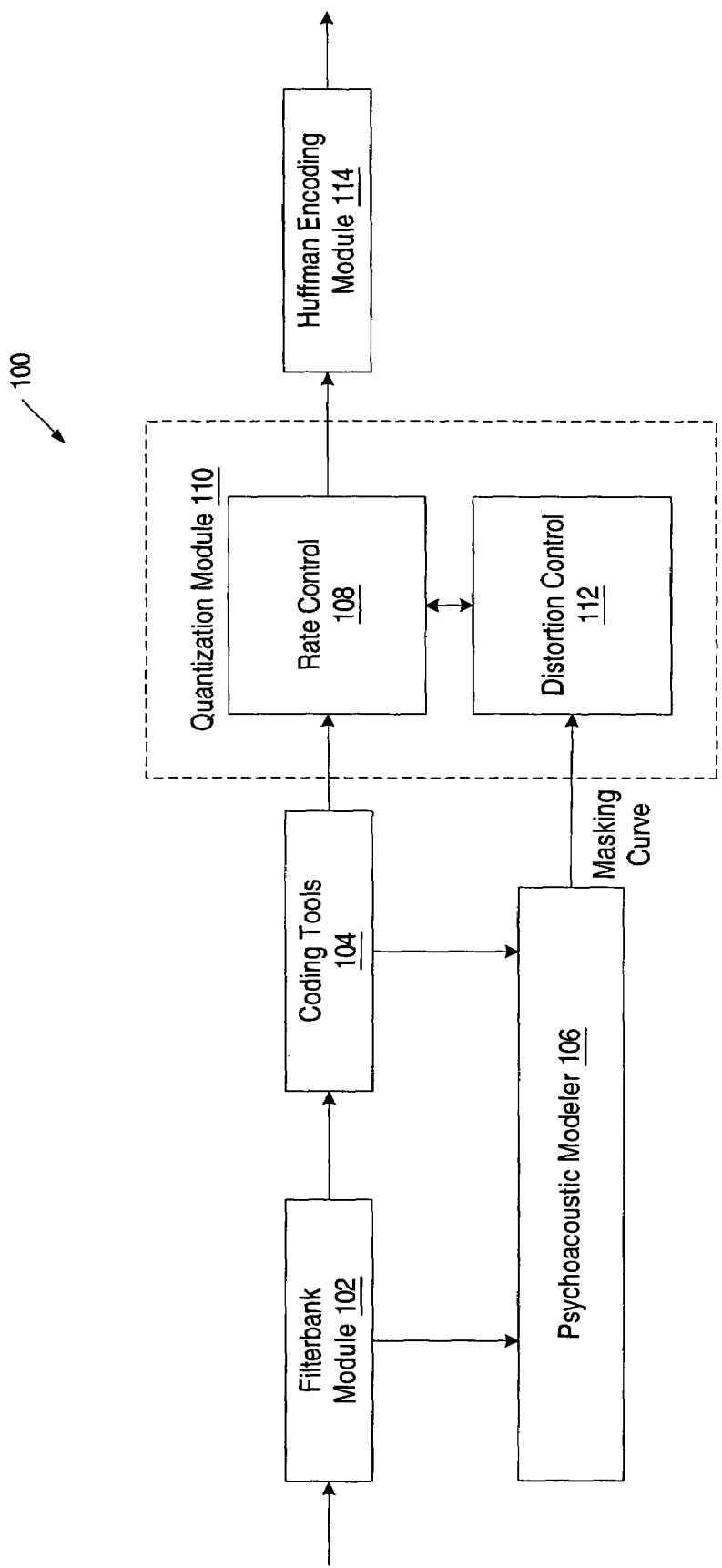
FIG. 1 is a block diagram of one embodiment of an encoding system.

Beginning with an overview of the operation of the invention, FIG. 1 illustrates one embodiment of an encoding system 100. The encoding system 100 is in compliance with MPEG audio coding standards (e.g., the MPEG-2 AAC standard, the MPEG-4 AAC standard, etc.) that are collectively referred to herein as the MPEG standard. The encoding system 100 includes a filterbank module 102, coding tools 104, a psychoacoustic modeler 106, a quantization module 110, and a Huffman encoding module 114.

The filterbank module 102 receives a pulse code modulation (PCM) signal, modulates it using a window function, and then performs a modified discrete cosine transform operation (MDCT). The window function modulates the signal using two types of operation, one being a long window type in which a signal to be analyzed is expanded in time for improved frequency resolution, the other being a short window type in which a signal to be analyzed is shortened in time for improved time resolution. The long window type is used in the case where there exists only a stationary signal, and the short window type is used when there is a rapid signal change. By using these two types of operation according to the characteristics of a signal to be analyzed, it is possible to prevent the generation of unpleasant noise called a pre-echo, which would otherwise result from an insufficient time resolution. The MDCT operation is performed to convert the time-domain signal into a number of samples of frequency spectral data.

The coding tools 104 include a set of optional tools for spectral processing. For example, the coding tools may include a temporal noise shaping (TNS) tool and a prediction tool. The TNS tool may be used to control the temporal shape of the noise within each window of the transform and to solve the pre-echo problem. The prediction tool may be used to remove the correlation between the samples.

The psychoacoustic modeler 106 analyzes the samples to determine an auditory masking curve. The auditory masking curve indicates the maximum amount of noise that can be injected into each respective sample without becoming audible. What is audible in this respect is based on psychoacoustic models of human hearing. The auditory masking curve serves as an estimate of a desired noise spectrum.

The quantization module 110 is responsible for quantizing the samples using optimal scale factors (also known as quantizers). The optimal scale factors are determined using rate control 108 and distortion control 112. The rate control 108 is performed in accordance with the required bit-rate, and the distortion control 112 is performed in accordance with the desired noise spectrum as defined by the masking curve provided by the psychoacoustic modeler 106. The resulting quantized spectral coefficients are grouped into scalefactor bands (SFBs). Each SFB includes coefficients that resulted from the use of the same quantizer. In one embodiment, each SFB contains a multiple of 4 quantized spectral coefficients.

The Huffman encoding module 114 is responsible for selecting an optimal Huffman codebook for each group of quantized spectral coefficients and performing the Huffman-encoding operation using the optimal Huffman codebook. The resulting variable length code (VLC) and data identifying the codebook used in the encoding (and some other information when necessary) are subsequently assembled into a bit stream.

In one embodiment, eleven Huffman codebooks are provided by the MPEG standard for selection. Each Huffman codebook includes indexes of data items to be encoded, corresponding "codewords" (hexadecimal representations of encoded data items) and the code length of each codeword. Candidate Huffman codebooks that can be selected for a group of spectral data are limited by the largest absolute value (LAV) of the spectral data within the group. That is, the LAV of the spectral data has to be smaller than the LAV associated with a candidate Huffman codebook. As a result, the number of candidate Huffman codebooks that are to be used for a selection of an optimal codebook for a group of data varies, depending on the LAV within the group of data, from two candidate codebooks for the LAV less than 2 to eleven candidate codebooks for the LAV greater than, or equal to, 13.

As will be discussed in more detail below, the Huffman encoding module 114 limits the number of candidate Huffman codebooks for a group of data to 2 by creating a set of difference tables, pre-computing their content and storing them in memory for use during Huffman encoding operations. Each difference table is associated with two distinct Huffman codebooks. In one embodiment, each entry in a difference table contains a length difference value that is a difference between corresponding code length entries from the two Huffman codebooks associated with the difference table.

A conventional codebook selection method will now be discussed in more detail to illustrate the advantages of the operation of the Huffman encoding module 114.

FIG. 2 illustrates a table 200 containing parameters of Huffman codebooks as provided by the MPEG standard.

Referring to FIG. 2, the table 200 provides codebook number information 202, sign information 204, codebook dimension information 206, codebook LAV information 208, and codebook table information 210. The codebook dimension information 206 specifies whether a Huffman codebook encodes 2- or 4-tuples of quantized spectral coefficients. The codebook sign information 204 indicates whether a Huffman codebook can represent signed (e.g., unsigned_cb[i]=0) or unsigned (e.g., unsigned_cb[i]=1) spectral data. If an unsigned codebook is selected, a codeword extracted from the codebook for each non-zero coefficient in the group of data is provided with sign bits that immediately follow the codeword.

A group of data may be an SFB or a section. A section is formed by one or more SFBs that are represented by a single Huffman codebook.

Figure 3:
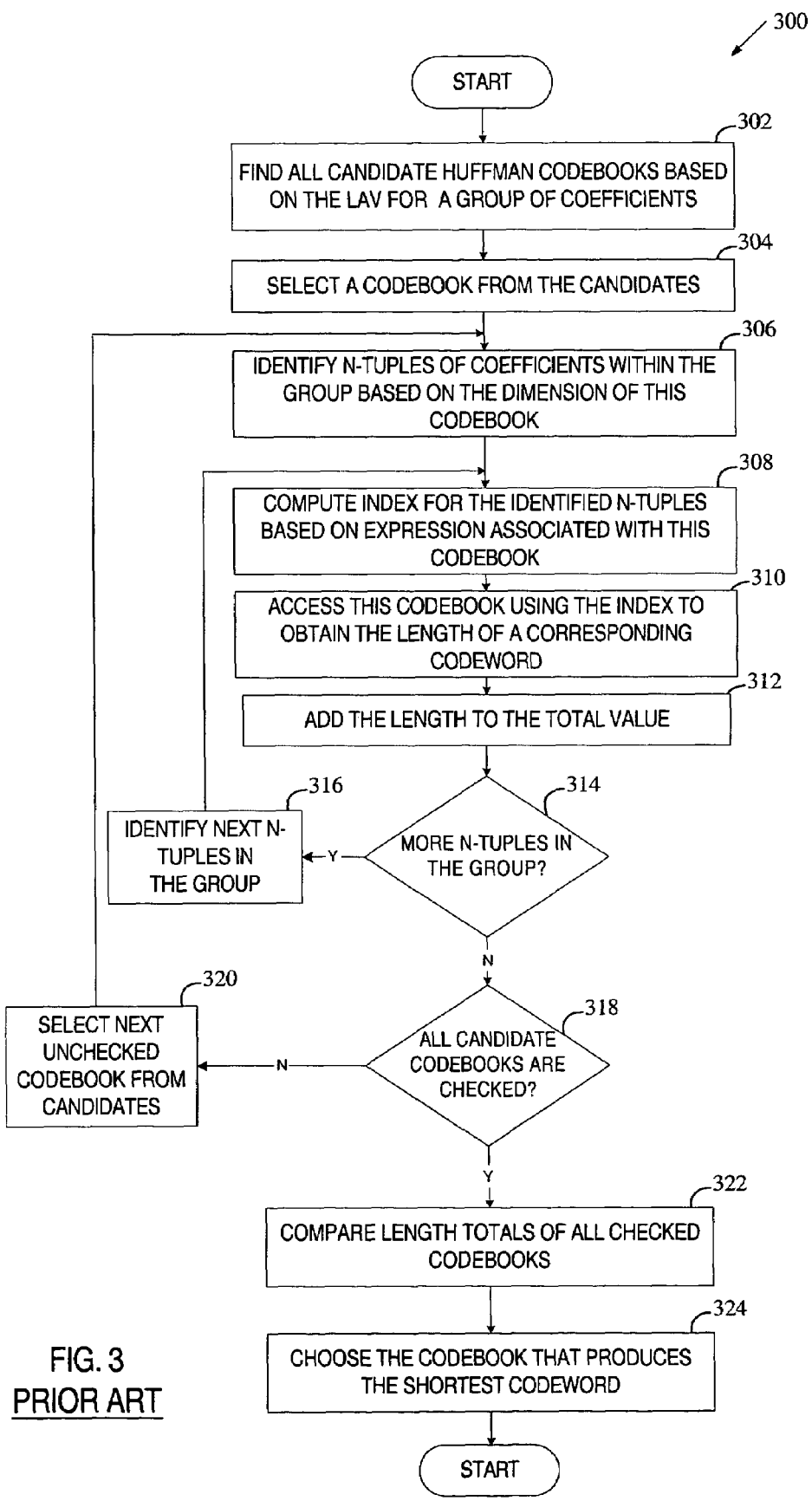
FIG. 3 is a flow diagram of a codebook selection method, according to a prior art embodiment.

FIG. 3 is a flow diagram of a codebook selection method 300 according to a prior art embodiment. Method begins 300 with finding all candidate codebooks for a group of data based on the LAV within the group (processing block 302). As illustrated in the table 200, if the LAV within the group is less than 2, then the candidate Huffman codebooks are codebooks 0, 1 and 2. If the LAV within the group is less than 3, then candidate Huffman codebooks are codebooks 0 through 4. If the LAV within the group is less than 5, then candidate Huffman codebooks are codebooks 0 through 6. If the LAV within the group is less than 8, then candidate Huffman codebooks are codebooks 0 through 8. If the LAV within the group is less than 13, then candidate Huffman codebooks are codebooks 0 through 10. Finally, if the LAV within the group is greater than, or equal to, 13, then candidate Huffman codebooks are codebooks 0 through 11.

Next, a first codebook is selected from the candidate codebooks for processing (processing block 304).

At processing block 306, the dimension of the selected codebook is checked in the table 200 to determine whether this codebook encodes 2- or 4-tuples of coefficients and, accordingly, the first 2- or 4-tuples of coefficients are identified within the group of data.

At processing block 308, a codebook index is computed for these 2- or 4-tuples of coefficients using an expression associated with the selected codebook. Based on the MPEG standard, the expressions for computing the codebook index are as follows:

(a) for codebooks 1 and 2

$$codebook\_index = 27*C[i] + 9*C[i+1] + 3*C[i+2] + C[i+3] + 46,$$

(b) for codebooks 3 and 4

$$codebook\_index = 27*abs(C[i]) + 9*abs(C[i+1]) + 3*abs(C[i+2]) + abs(C[i+3]),$$

(c) for codebooks 5 and 6

$$codebook\_index = 9*C[i] + C[i+1] + 40,$$

(b) for codebooks 7 and 8

$$codebook\_index = 8*abs(C[i]) + abs(C[i+1]),$$

(b) for codebooks 9 and 10

$$codebook\_index = 13*abs(C[i]) + abs(C[i+1]),$$

wherein C[i], C[i+1], C[i+2] and C[i+3] are values of quantized spectral coefficients within the group of data.

If the LAV within the group of data is greater than, or equal to, 12, the expressions for computing the codebook index are as follows:

(a) if abs(C[i])>16 and abs(C[i+1])>16

$$codebook\_index = 272 + abs(C[i]),$$

(b) if abs(C[i])>16 and abs(C[i+1])<16

$$codebook\_index = 17*abs(C[i]) + 16,$$

(c) if abs(C[i])<16 and abs(C[i+1])>16

$$codebook\_index = 17*abs(C[i]) + abs(C[i+1]).$$

Once the index is computed using one of the above expressions, the selected codebook is accessed using the index to obtain the length of a corresponding codeword (processing block 310). This length is then added to a total length value (which is initially equal to 0) accumulated for this codebook (processing block 312).

Next, a determination is made as to whether there are more unprocessed 2- or 4-tuples of coefficients in the group (decision box 314). If so, the next 2- or 4-tuples of coefficients are identified (processing block 316), and method 300 returns to processing block 308. Once all the coefficients in the group are covered, method 300 selects a next unchecked codebook from the candidate codebooks (processing block 320) and repeats processing of blocks 306 through 314. The processing of these blocks is repeated until all candidate codebooks are checked (decision box 318). Then, the total length values accumulated for the candidate codebooks are compared (processing block 322) and the codebook that produces the shortest codeword is chosen as an optimal codebook for this group of spectral data (processing block 324).

Thus, the above-described conventional method repeats processing blocks 306 through 318 for each candidate codebook table, which may result in up to 11 repetitions.

The Huffman encoding module 114 of FIG. 1 eliminates these repetitions by creating a set of difference tables, pre-computing their content and storing them in memory for use during Huffman encoding operations. As discussed above, each difference table is associated with two distinct Huffman codebooks. For example, difference table 1 may be associated with codebooks 1 and 2, difference table 2 may be associated with codebooks 3 and 4, difference table 3 may be associated with codebooks 5 and 6, difference table 4 may be associated with codebooks 7 and 8, and difference table 5 may be associated with codebooks 9 and 10. In one embodiment, each entry in a difference table contains a length difference value that is a difference between corresponding code length entries from the two Huffman codebooks associated with the difference table.

Figure 4:
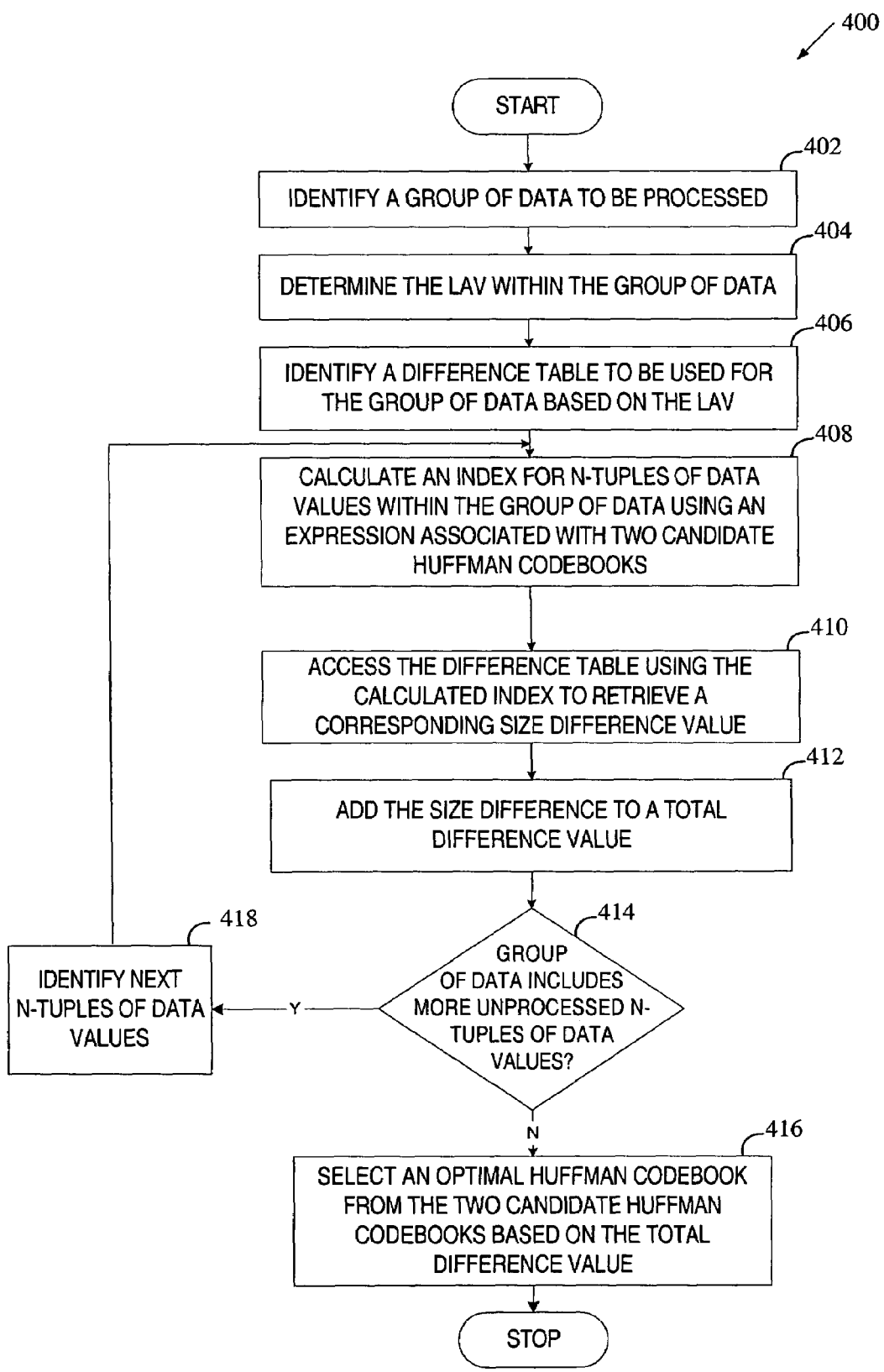
FIG. 4 is a flow diagram of one embodiment of a codebook selection process performed by a Huffman encoding module 114 of FIG. 1.
Figure 5:
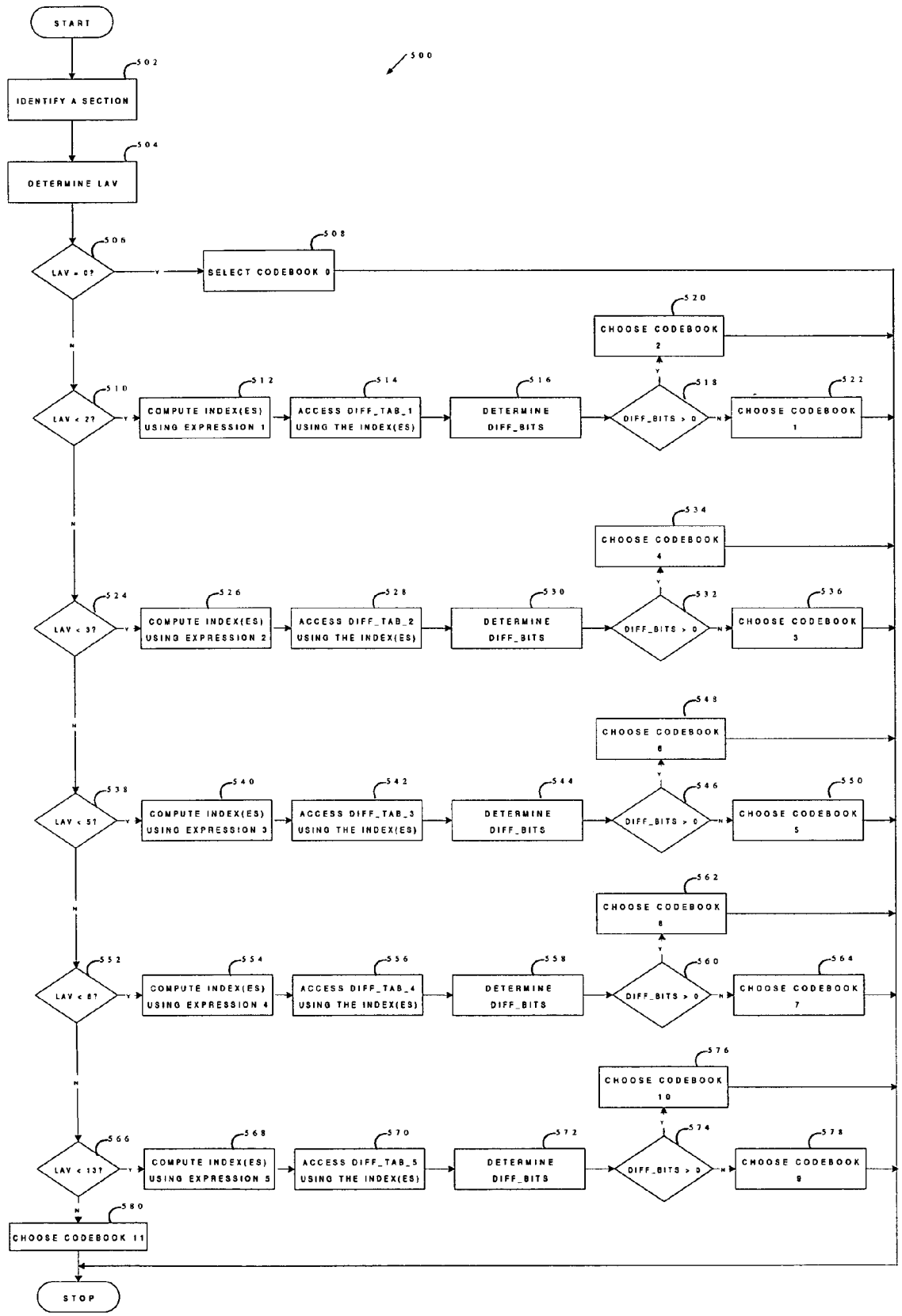
FIG. 5 is a flow diagram of one embodiment of a codebook selection process used for MPEG-compliant audio encoding.

FIGS. 4 and 5 are flow diagrams of two embodiments of a codebook selection process that may be performed by a Huffman encoding module 114 of FIG. 1. The process may be performed by processing logic that may comprise hardware (e.g., circuitry, dedicated logic, etc.), software (such as run on a general purpose computer system or a dedicated machine), or a combination of both. For software-implemented processes, the description of a flow diagram enables one skilled in the art to develop such programs including instructions to carry out the processes on suitably configured computers (the processor of the computer executing the instructions from computer-readable media, including memory). The computer-executable instructions may be written in a computer programming language or may be embodied in firmware logic. If written in a programming language conforming to a recognized standard, such instructions can be executed on a variety of hardware platforms and for interface to a variety of operating systems. In addition, the embodiments of the present invention are not described with reference to any particular programming language. It will be appreciated that a variety of programming languages may be used to implement the teachings described herein. Furthermore, it is common in the art to speak of software, in one form or another (e.g., program, procedure, process, application, module, logic . . . ), as taking an action or causing a result. Such expressions are merely a shorthand way of saying that execution of the software by a computer causes the processor of the computer to perform an action or produce a result. It will be appreciated that more or fewer operations may be incorporated into the processes illustrated in FIGS. 4 and 5 without departing from the scope of the invention and that no particular order is implied by the arrangement of blocks shown and described herein.

Referring to FIG. 4, processing logic begins with identifying a group of data (e.g., a SFB, a section, etc.) to be processed (processing block 402). Next, processing logic determines the LAV within the group of data (processing block 404) and identifies a difference table to be used for this group of data based on the LAV (processing block 406). The difference table is associated with two specific Huffman codebooks that are to be considered in the selection of an optimal codebook for this group of data. In one embodiment, processing logic identifies the difference table based on the predefined correspondence between the LAV and the difference table. In one embodiment, the predefined correspondence is determined via the associated candidate Huffman codebooks that are, in turn, linked to the LAV based on statistical data indicating that these two candidate codebooks have the highest likelihood of being an optimal codebook for this LAV. In another embodiment, processing logic identifies the difference table by dynamically determining the correspondence between the LAV and the difference table during each codebook selection operation. The determination may be based on statistical data collected during prior codebook selection operations.

At processing block 408, processing logic calculates an index for first n-tuples of data values within the group of data using an expression associated with the two candidate Huffman codebooks. The number n depends on the dimension of the candidate Huffman codebooks as defined, for example, by table 200 of FIG. 2. In one embodiment, the expression is constructed to eliminate multiplication operations, thus accelerating the index computation process. In one embodiment, the expressions associated with different pairs of Huffman codebooks were developed based on the expressions provided by the MPEG standard and the operations involved in computing and structuring the difference tables.

Next, processing logic accesses the difference table using the calculated index to retrieve a corresponding size difference value (processing block 410) and adds this value to a total difference value (processing block 412).

At decision box 414, processing logic determines whether the group of data includes more unprocessed n-tuples of data values. If so, processing logic identifies next n-tuples within the group of data (processing block 418) and repeats processing blocks 410 through 414. This processing is repeated until all data values in the group are processed.

Further, processing logic selects an optimal Huffman codebook from the two candidate Huffman codebooks based on the total difference value (processing block 416). In one embodiment, processing logic selects a first of the two candidate Huffman codebooks if the total difference value is greater than zero. Otherwise, processing logic selects a second of the two candidate Huffman codebooks.

FIG. 5 is a flow diagram of one embodiment of a codebook selection process 500 used for MPEG-compliant audio encoding. Based on the MPEG standard, 11 Huffman codebooks are provided for selecting an optimal codebook for each section.

Referring to FIG. 5, processing logic begins with identifying a section to be processed (processing block 502). A section may include one or more SFBs, with each SFB having a multiple of 4-tuples of quantized spectral coefficients.

Next, processing logic determines the LAV within the section (processing block 404).

At decision box 506, processing logic determines whether the LAV is equal to zero. If so, processing logic selects codebook 0 to Huffman encode the section (processing block 508). If not, processing logic determines whether the LAV is less than 2 (decision box 510). If so, processing logic calculates the index for each n-tuples of quantized spectral coefficients using expression 1 associated with Huffman codebooks 1 and 2 (processing block 512). In one embodiment, expression 1 is defined as $$\text{codebook\_index}=C[i]<<6+C[i+1]<<4+C[i+2]<<2+C[i+3]+85.$$

Next, processing logic accesses difference table 1 using the index for each n-tuples of quantized spectral coefficients to obtain a corresponding bit difference value (processing block 514). Each entry in the difference table 1 (DIFF_TAB_1) is a difference in length of the corresponding codewords from the codebooks 1 and 2.

At processing block 516, processing logic determines a total bit difference value. If the total bit difference value is greater than zero (decision box 518), processing logic selects codebook 2 (processing block 520). Otherwise, processing logic selects codebook 1 (processing block 522).

If processing logic determines that LAV is less than 3 (decision box 524), processing logic calculates the index for each n-tuples of quantized spectral coefficients using expression 2 associated with Huffman codebooks 3 and 4 (processing block 526). In one embodiment, expression 2 is defined as $$\text{codebook\_index}=abs(C[i])<<6+abs(C[i+1])<<4+abs(C[i+2])<<2+abs(C[i+3]).$$

Next, processing logic accesses difference table 2 using the index for each n-tuples of quantized spectral coefficients to obtain a corresponding bit difference value (processing block 528). Each entry in the difference table 2 (DIFF_TAB_2) is a difference in length of the corresponding codewords from the codebooks 3 and 4.

At processing block 530, processing logic determines a total bit difference value. If the total bit difference value is greater than zero (decision box 532), processing logic selects codebook 4 (processing block 534). Otherwise, processing logic selects codebook 3 (processing block 536).

If processing logic determines that the LAV is less than 5 (decision box 538), processing logic calculates the index for each n-tuples of quantized spectral coefficients using expression 3 associated with Huffman codebooks 5 and 6 (processing block 540). In one embodiment, expression 3 is defined as $$\text{codebook\_index}=C[i]<<4+C[i+1]+68.$$

Next, processing logic accesses difference table 3 using the index for each n-tuples of quantized spectral coefficients to obtain a corresponding bit difference value (processing block 542). Each entry in the difference table 3 (DIFF_TAB_3) is a difference in length of the corresponding codewords from the codebooks 5 and 6.

At processing block 544, processing logic determines a total bit difference value. If the total bit difference value is greater than zero (decision box 546), processing logic selects codebook 6 (processing block 548). Otherwise, processing logic selects codebook 5 (processing block 550).

If processing logic determines that the LAV is less than 8 (decision box 552), processing logic calculates the index for each n-tuples of quantized spectral coefficients using expression 4 associated with Huffman codebooks 7 and 8 (processing block 554). In one embodiment, expression 4 is defined as $$\text{codebook\_index}=abs(C[i])<<3+abs(C[i+1]).$$

Next, processing logic accesses difference table 4 using the index for each n-tuples of quantized spectral coefficients to obtain a corresponding bit difference value (processing block 556). Each entry in the difference table 4 (DIFF_TAB_4) is a difference in length of the corresponding codewords from the codebooks 7 and 8.

At processing block 558, processing logic determines a total bit difference value. If the total bit difference value is greater than zero (decision box 560), processing logic selects codebook 8 (processing block 562). Otherwise, processing logic selects codebook 7 (processing block 564).

If processing logic determines that the LAV is less than 13 (decision box 566), processing logic calculates the index for each n-tuples of quantized spectral coefficients using expression 5 associated with Huffman codebooks 9 and 10 (processing block 568). In one embodiment, expression 5 is defined as $$\text{codebook\_index}=abs(C[i])<<4+abs(C[i+1]).$$

Next, processing logic accesses difference table 5 using the index for each n-tuples of quantized spectral coefficients to obtain a corresponding bit difference value (processing block 570). Each entry in the difference table 5 (DIFF_TAB_5) is a difference in length of the corresponding codewords from the codebooks 9 and 10.

At processing block 572, processing logic determines a total bit difference value. If the total bit difference value is greater than zero (decision box 574), processing logic selects codebook 10 (processing block 576). Otherwise, processing logic selects codebook 9 (processing block 578).

If processing logic determines at decision box 566 that the LAV is not less than 13, then processing logic selects codebook 11 to Huffman encode the section (processing block 580).

Figure 6:
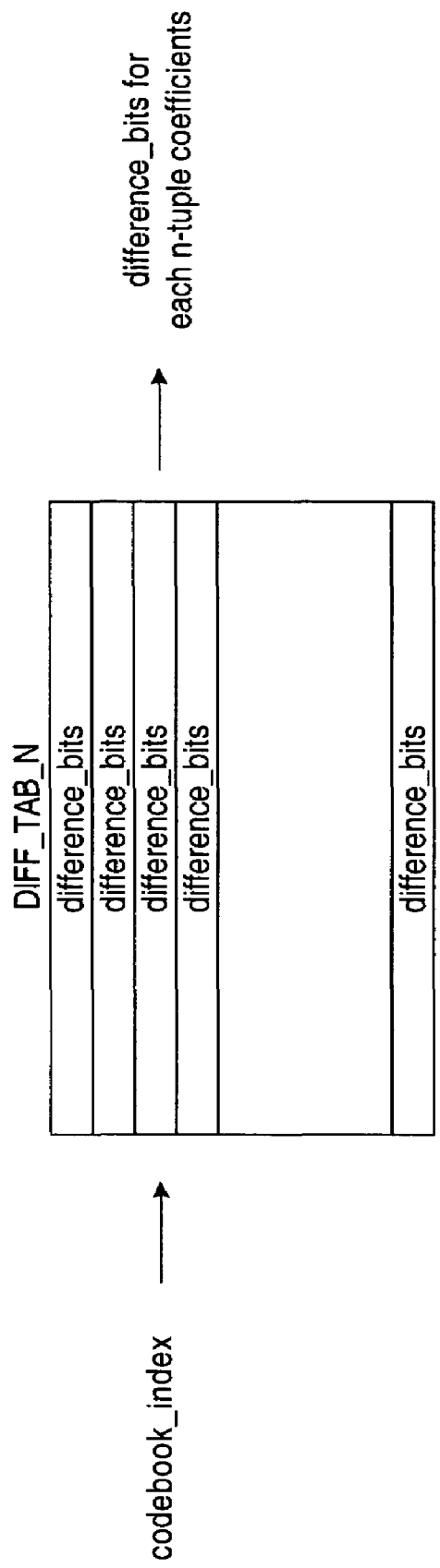
FIG. 6 illustrates the structure of a difference table according to one embodiment of the present invention.

In one embodiment, each difference table stores bit difference values as a list of entries. As a result, each computed index represents an order number and points to an entry associated with this order number within the list. FIG. 6 illustrates the structure of a difference table according to one embodiment of the present invention.

FIG. 7 illustrates exemplary contents of difference tables 1 through 5, according to one embodiment of the present invention.

Figure 8:
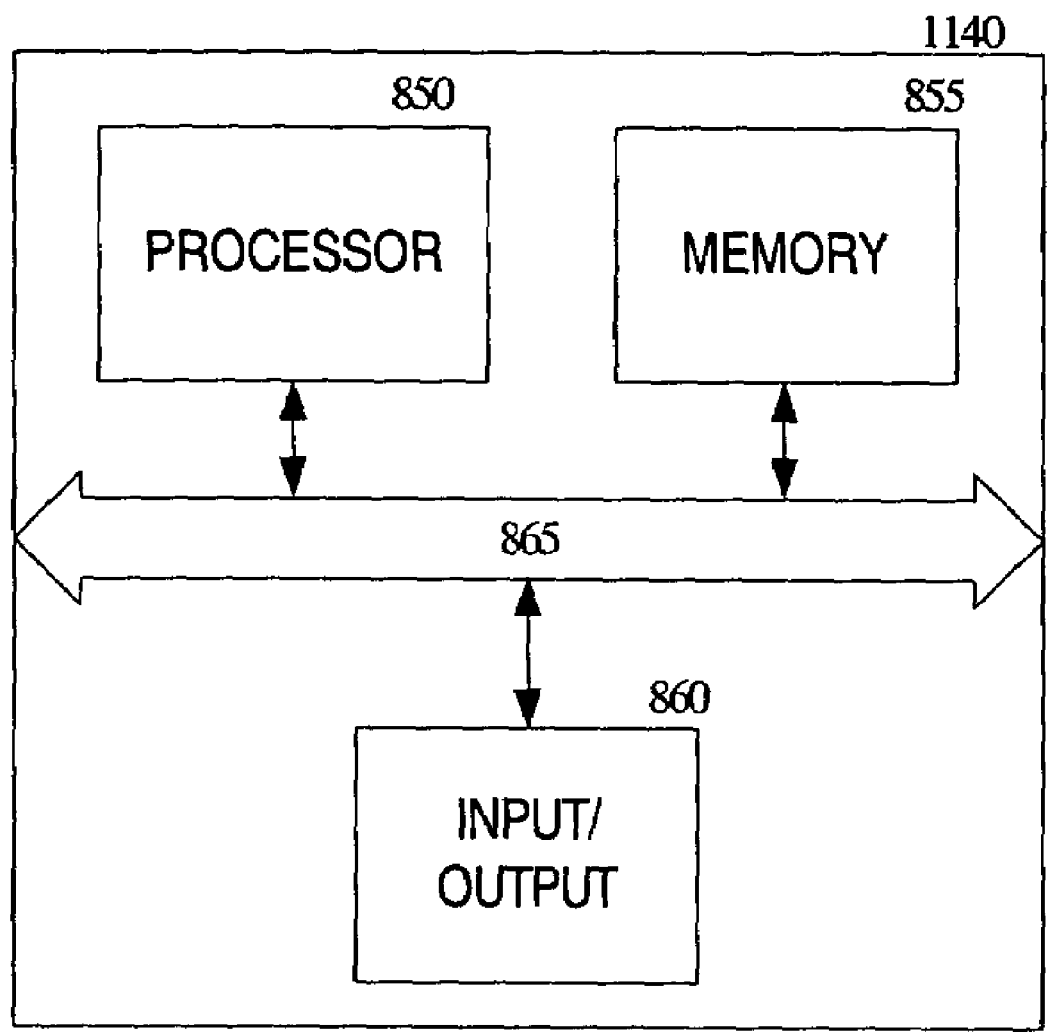
FIG. 8 is a block diagram of a computer environment suitable for practicing embodiments of the present invention.

The following description of FIG. 8 is intended to provide an overview of computer hardware and other operating components suitable for implementing the invention, but is not intended to limit the applicable environments. FIG. 8 illustrates one embodiment of a computer system suitable for use as an encoding system 100 or just a Huffman encoding module 114 of FIG. 1.

The computer system 840 includes a processor 850, memory 855 and input/output capability 860 coupled to a system bus 65. The memory 855 is configured to store instructions which, when executed by the processor 850, perform the methods described herein. In addition, the memory 855 may be configured to store a set difference tables used by the Huffman encoding module 114. Input/output 860 also encompasses various types of computer-readable media, including any type of storage device that is accessible by the processor 850. One of skill in the art will immediately recognize that the term "computer-readable medium/media" further encompasses a carrier wave that encodes a data signal. It will also be appreciated that the system 840 is controlled by operating system software executing in memory 855. Input/output and related media 860 store the computer-executable instructions for the operating system and methods of the present invention. The Huffman encoding module 114 shown in FIG. 1 may be a separate component coupled to the processor 850, or may be embodied in computer-executable instructions executed by the processor 850. In one embodiment, the computer system 840 may be part of, or coupled to, an ISP (Internet Service Provider) through input/output 860 to transmit or receive image data over the Internet. It is readily apparent that the present invention is not limited to Internet access and Internet web-based sites; directly coupled and private networks are also contemplated.

It will be appreciated that the computer system 840 is one example of many possible computer systems that have different architectures. A typical computer system will usually include at least a processor, memory, and a bus coupling the memory to the processor. One of skill in the art will immediately appreciate that the invention can be practiced with other computer system configurations, including multiprocessor systems, minicomputers, mainframe computers, and the like. The invention can also be practiced in distributed computing environments where tasks are performed by remote processing devices that are linked through a communications network.

Various aspects of Huffman encoding have been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention.

What is claimed is:

1. A method comprising:
    determining a largest absolute value (LAV) within a group of data;
    identifying, based on the LAV, a difference table to be used for selecting an optimal Huffman codebook for the group of data, the difference table being associated with two of a plurality of Huffman codebooks, wherein each entry in the difference table contains a length difference value that is a difference between corresponding code length entries in the two associated Huffman codebooks;
    calculating one or more indexes for the group of data using an expression associated with the two of the plurality of Huffman codebooks;
    determining a size difference value for the group of data using the one or more indexes and the difference table;
    selecting one of the two of the plurality of Huffman codebooks based on the determined size difference value; and
    encoding the group of data using the selected Huffman codebook to output an encoded audio signal.

2. The method of claim 1 further comprising:
    creating a plurality of difference tables, each of the plurality of difference tables being associated with distinct two of the plurality of Huffman codebooks.

3. The method of claim 1 wherein the group of data is a section containing one or more n-tuples of quantized spectral coefficients.

4. The method of claim 1 wherein determining a size difference value for the group of data comprises:
    for each of the one or more indexes, retrieving a corresponding entry from the difference table; and
    summing the retrieved entry to determine the size difference value for the group of data.

5. The method of claim 1 wherein one of the two of the plurality of Huffman codebooks is selected depending on whether the determined size difference value is greater than zero.

6. The method of claim 1 wherein the expression associated with the two of the plurality of Huffman codebooks does not include multiplication operations.

7. The method of claim 1 wherein the difference table is identified based on a predefined correspondence between the LAV and the difference table.

8. The method of claim 7 wherein the predefined correspondence is determined based on statistical data that indicates that the associated two of the plurality of Huffman codebooks have high likelihood of being an optimal codebook for the group of data with said LAV.

9. The method of claim 1 wherein:
    the plurality of Huffman codebooks represents eleven Huffman codebooks; and
    the difference table is one of five difference tables.

10. The method of claim 9 wherein the five difference tables includes a first difference table associated with a first and second of the eleven Huffman codebooks, a second difference table associated with a third and fourth of the eleven Huffman codebooks, a third difference table associated with a fifth and sixth of the eleven Huffman codebooks, a fourth difference table associated with a seventh and eighth of the eleven Huffman codebooks, and a fifth difference table associated with a ninth and tenth of the eleven Huffman codebooks.

11. A computer readable medium that provides instructions, which when executed on a processor cause the processor to perform a method comprising:

determining a largest absolute value (LAV) within a group of data;

identifying, based on the LAV, a difference table to be used for selecting an optimal Huffman codebook for the group of data, the difference table being associated with two of a plurality of Huffman codebooks, wherein each entry in the difference table contains a length difference value that is a difference between corresponding code length entries in the two associated Huffman codebooks;

calculating one or more indexes for the group of data using an expression associated with the two of the plurality of Huffman codebooks;

determining a size difference value for the group of data using the one or more indexes and the difference table;

selecting one of the two of the plurality of Huffman codebooks based on the determined size difference value; and encoding the group of data using the selected Huffman codebook to output an encoded audio signal.

12. The computer readable medium of claim 11 wherein the method further comprises:

creating a plurality of difference tables, each of the plurality of difference tables being associated with distinct two of the plurality of Huffman codebooks.

13. The computer readable medium of claim 11 wherein the group of data is a section containing one or more n-tuples of quantized spectral coefficients.

14. The computer readable medium of claim 11 wherein the difference table is identified based on a predefined correspondence between the LAV and the difference table.

15. A computerized system comprising:

a memory; and at least one processor coupled to the memory, the at least one processor executing a set of instructions which cause the at least one processor to determine a largest absolute value (LAV) within a group of data;

identify, based on the LAV, a difference table to be used for selecting an optimal Huffman codebook for the group of data, the difference table being associated with two of a plurality of Huffman codebooks, wherein each entry in the difference table contains a length difference value that is a difference between corresponding code length entries in the two associated Huffman codebooks;

calculate one or more indexes for the group of data using an expression associated with the two of the plurality of Huffman codebooks;

determine a size difference value for the group of data using the one or more indexes and the difference table;

select one of the two of the plurality of Huffman codebooks based on the determined size difference value; and encode the group of data using the selected Huffman codebook to output an encoded audio signal.

16. The system of claim 15 wherein the at least one processor executes a set of instructions which cause the at least one processor to further create a plurality of difference tables, each of the plurality of difference tables being associated with distinct two of the plurality of Huffman codebooks.

17. The system of claim 15 wherein the group of data is a section containing one or more n-tuples of quantized spectral coefficients.

18. The system of claim 15 wherein the difference table is identified based on a predefined correspondence between the LAV and the difference table.

19. An encoding apparatus comprising:

a set of difference tables, each difference table in the set being associated with two of a plurality of Huffman codebooks, wherein each entry in a difference table contains a length difference value that is a difference between corresponding code length entries in the associated two associated Huffman codebooks; and a Huffman encoding module to determine a largest absolute value (LAV) within a group of data, to identify, based on the LAV, one difference table within the set that is to be used for selecting an optimal Huffman codebook for the group of data, to calculate one or more indexes for the group of data using an expression associated with two of the plurality of Huffman codebooks that are associated with the identified difference table, to determine a size difference value for the group of data using the one or more indexes and the identified difference table, to select one of the two associated Huffman codebooks based on the determined size difference value, and to encode the group of data using the selected Huffman codebook to output an encoded audio signal.

20. The encoding apparatus of claim 19 wherein the group of data is a section containing one or more n-tuples of quantized spectral coefficients.

21. The encoding apparatus of claim 19 wherein the difference table is identified based on a predefined correspondence between the LAV and the difference table.

22. An apparatus comprising:

means for determining a largest absolute value (LAV) within a group of data;

means for identifying, based on the LAV, a difference table to be used for selecting an optimal Huffman codebook for the group of data, the difference table being associated with two of a plurality of Huffman codebooks, wherein each entry in the difference table contains a length difference value that is a difference between corresponding code length entries in the two associated Huffman codebooks;

means for calculating one or more indexes for the group of data using an expression associated with the two of the plurality of Huffman codebooks;

means for determining a size difference value for the group of data using the one or more indexes and the difference table;

means for selecting one of the two of the plurality of Huffman codebooks based on the determined size difference value; and means for encoding the group of data using the selected Huffman codebook to output an encoded audio signal.

* * * * *